United States Patent
Iwasaki et al.

(10) Patent No.: US 6,756,686 B2
(45) Date of Patent: Jun. 29, 2004

(54) SEMICONDUCTOR DEVICE

(75) Inventors: Toshihiro Iwasaki, Tokyo (JP);
Keiichiro Wakamiya, Tokyo (JP);
Michitaka Kimura, Tokyo (JP);
Yasumichi Hatanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/224,342

(22) Filed: Aug. 21, 2002

(65) Prior Publication Data

US 2003/0057537 A1 Mar. 27, 2003

(30) Foreign Application Priority Data

Sep. 27, 2001 (JP) ........................................ 2001-296333

(51) Int. Cl.[7] .............................................. H01L 23/48
(52) U.S. Cl. ........................ 257/778; 257/702; 257/786
(58) Field of Search ................................. 257/778, 702, 257/786

(56) References Cited

U.S. PATENT DOCUMENTS 6,380,002 B2 * 4/2002 Hsu et al. ................... 438/118
6,400,019 B1 * 6/2002 Hirashima et al. .......... 257/737
6,509,206 B2 * 1/2003 Iwasaki et al. ............. 438/107

* cited by examiner

*Primary Examiner*—Jerome Jackson
(74) *Attorney, Agent, or Firm*—McDermott, Will & Emery

(57) ABSTRACT

A semiconductor device includes a first substrate, a second substrate, a plurality of conductors, and supporting members. The first substrate has a plurality of electrode portions disposed on one side thereof. The second substrate has a plurality of electrode portions disposed on one side thereof. The conductors are for connecting the plurality of electrode portions of the first substrate to the plurality of electrode portions of the second substrate. The supporting members supporting the first substrate and the second substrate are disposed on a location where resonance caused by ultrasonic oscillation externally supplied is restrained in the state where the first substrate is connected to the second substrate. The supporting members prevent irregular oscillation and resonance caused by the ultrasonic oscillation.

17 Claims, 8 Drawing Sheets

SEMICONDUCTOR DEVICE

BACKGROUND OF THE INVENTION

1. Field of the Invention

The present invention relates to a semiconductor device wherein a substrate is bonded two another substrate by a bonding method utilizing ultrasonic oscillation. More specifically, the present invention relates to a semiconductor device wherein a chip (semiconductor substrate) is bonded to a chip-mounting substrate (circuit substrate) or a chip.

2. Background Art

Heretofore, a technique for bonding a chip (semiconductor substrate) to a chip-mounting substrate (circuit substrate) by bonding method utilizing ultrasonic oscillation has been used. In particular, for chips having small surface areas, such as SAW (surface acoustic wave) devices, bonding methods, such as FCB (flip chip bonding) wherein an Au bump formed on an electrode pad exposed on the chip is bonded with thermal compression to a terminal electrode having an Au-plated layer formed on a chip-mounting substrate while supplying ultrasonic oscillation, has been widely used.

A conventional semiconductor device will be briefly described below referring to FIG. 12A to FIG. 12D. FIG. 12A to FIG. 12D are schematic sectional views of a conventional semiconductor device in each bonding step of the manufacturing process.

In FIG. 12A to FIG. 12D, the reference numeral 1 denotes a chip as a substrate; 1a denotes the facing surface (one side) of the chip 1 facing a chip mounting substrate after bonding; 2 denotes an electrode pad (electrode portion) formed so as to be exposed on the facing surface 1a of the chip 1; 3 denotes a bump (conductor for connecting) for electrically and mechanically connecting the electrode pad 2 with a terminal electrode; 6 denotes a chip-mounting substrate (second substrate), such as a mounting board and an interposer; 6a denotes the facing surface (one side) of the chip-mounting substrate 6 facing the chip 1 after mounting; 7 denotes a terminal electrode (electrode portion) having an Au-plated surface layer formed so as to be exposed on the facing surface 6a of the chip-mounting substrate 6; 20 denotes a stage acting as a holding tool for holding the chip 1 in the mounting process: and 25 denotes a stage acting as a holding tool for holding the chip-mounting substrate 6 in the mounting process.

The semiconductor device constituted as described above is fabricated as described below. First, as FIG. 12A shows, bumps 3 are formed on electrode pads 2 exposed on the facing surface 1a of the chip 1 using a wire-bonding technique.

In the facing surface 1a of the chip 1, the regions other than the regions wherein the electrode pads 2 are exposed are coated with an insulating protective film. The electrode pads 2 are formed of Al or the like, and are electrically connected to the circuits in the chip 1. Furthermore, the bump 3 are formed of a metal such as Au, solder, Ag, Cu, Al, Bi, Zn, Sb, In, Pd, Si, or alloys thereof.

Next, as FIG. 12B shows, the facing surface 1a of the chip 1 is aligned with the facing surface 6a of the chip-mounting substrate 6.

Specifically, the chip-mounting substrate 6 is placed on the stage 25 so that the facing surface 6a whereon terminal electrodes 7 are formed faces up. On the other hand, the semiconductor device 1 is placed on the stage 20 so that the facing surface 1a whereon bumps 3 and the like are formed faces down. Thereafter, the stage 20 is moved so that the locations of the terminal electrodes 7 on the chip-mounting substrate 6 are aligned with the locations of the bumps 3 on the chip 1.

Here, the chip-mounting substrate 6 is formed of, for example, a glass-epoxy material. The terminal electrodes 7 are formed by sequentially laminating an Ni-plated layer and an Au-plated layer on a Cu wiring. The chip 1 and the chip-mounting substrate 6 are attracted and held on the stages 20 and 25, respectively, by air suction from hollow portions (not shown) provided in each of the stages 20 and 25.

Next, as FIG. 12C shows, a plurality of bumps 3 on the chip 1 are electrically and mechanically connected to a plurality of terminal electrodes 7 on the chip-mounting substrate 6 using a so-called thermo-compression bonding combined with ultrasonic oscillation.

Specifically, the bumps 3 and the terminal electrodes 7 are heated, a load W is applied from the chip 1 side as shown by the arrow in the drawing, and ultrasonic oscillation S in the direction of the other arrow in the drawing to connect the bumps 3 to the terminal electrodes 7.

Here, the frequency of the ultrasonic oscillation supplied to the chip 1 and the chip-mounting substrate 6 is about 60 kHz.

Thus, a semiconductor device wherein the chip 1 is mounted on the chip-mounting substrate 6 shown in FIG. 12D is manufactured.

In the above-described prior art, the method for bonding a substrate to another substrate utilizing ultrasonic oscillation is more advantageous than the bonding method using only heat and pressure in that both substrates can be connected at a low temperature.

However, if the bonding method utilizing ultrasonic oscillation is used not in the bonding process of the above-mentioned SAW device having small chips, but in the bonding process of devices such as a memory device having chips having a large surface area and having a large number of bumps, there was a problem of the deterioration of joint, such as the fluctuation of joining qualities and the damage of bumps in the junctions between bumps and terminal electrodes due to resonance of ultrasonic oscillation.

Especially, in the case of a chip having a large surface area, and having a plurality of bumps arranged as conductors for the connection to the peripheral portions, if ultrasonic oscillation is supplied after such a large chip has been mounted on a chip-mounting substrate, an oscillation having nodes (the portions where the amplitude is zero) in portions where connecting conductors are provided, and a loop (the portion where the amplitude is largest) in the central portion of the substrate where no connecting conductors are provided, is generated.

Since the structure comprising such a chip mounted on a chip-mounting substrate (hereafter referred to as a mounting material) has a large distance between nodes of the oscillation, and the chip-mounting substrate is formed of a glass-epoxy material of a low rigidity, the resonance frequency (natural frequency) as a mounting material is relatively low.

Therefore, there may be a case where the frequency of the ultrasonic oscillation applied in joining agrees with the resonance frequency of the mounting material, and in this case, the mounting material resonates. The resonance is an irregular oscillation having the direction different from the direction of the ultrasonic oscillation required for the connection of the substrates (for example, the oscillation in the direction shown by the arrow in FIG. 12D). Therefore, the contacting plane between a bump and a terminal electrode becomes unable to maintain contact when ultrasonic oscillation is supplied, and the joint will be deteriorated.

SUMMARY OF THE INVENTION

The object of the present invention is to solve the above-described problems. The present invention provides a semiconductor device ensuring that a substrate, such as a chip, having a relatively large surface area can be bonded to another substrate such as a chip-mounting substrate. A bonding method utilizing ultrasonic oscillation without generating resonance due to ultrasonic oscillation is used.

In one embodiment of the present invention, a semiconductor device includes a first substrate, a second substrate, a plurality of conductors, and supporting members. The first substrate has a plurality of electrode portions disposed on one side thereof. The second substrate has a plurality of electrode portions disposed on one side thereof. The conductors are for connecting the plurality of electrode portions of the first substrate to the plurality of electrode portions of the second substrate. The supporting members supporting the first substrate and the second substrate are disposed on a location where resonance caused by ultrasonic oscillation externally supplied is restrained in the state where the first substrate is connected to the second substrate.

In another embodiment of the present invention, a semiconductor device includes a first substrate, a second substrate, a plurality of conductors, and a high-rigidity member. The first substrate has a plurality of electrode portions disposed on one side thereof. The second substrate has a plurality of electrode portions disposed on one side thereof. The conductors are for connecting the plurality of electrode portions of the first substrate to the plurality of electrode portions of the second substrate. The high-rigidity member enhancing the rigidity-of the substrates is formed on the first substrate or the second substrate.

The semiconductor device preferably comprises a non-conductive resin member contacting to the first substrate and the second substrate.

A chip can be mounted on a substrate with a high bondability, because the supporting members prevent irregular oscillation and resonance caused by the ultrasonic oscillation.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

Figure 1A:
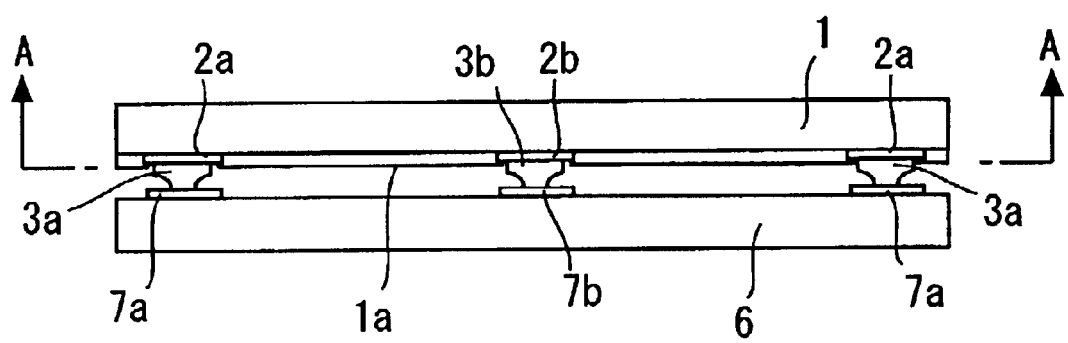
FIG. 1A is a schematic sectional view showing a semiconductor device according to First Embodiment of the present invention.

The embodiments of the present invention will be described in detail below referring to the drawings. The same or corresponding parts are denoted by the same reference numerals in the drawings, and the duplicated description thereof are simplified or omitted as required.

First Embodiment

Figure 1B:
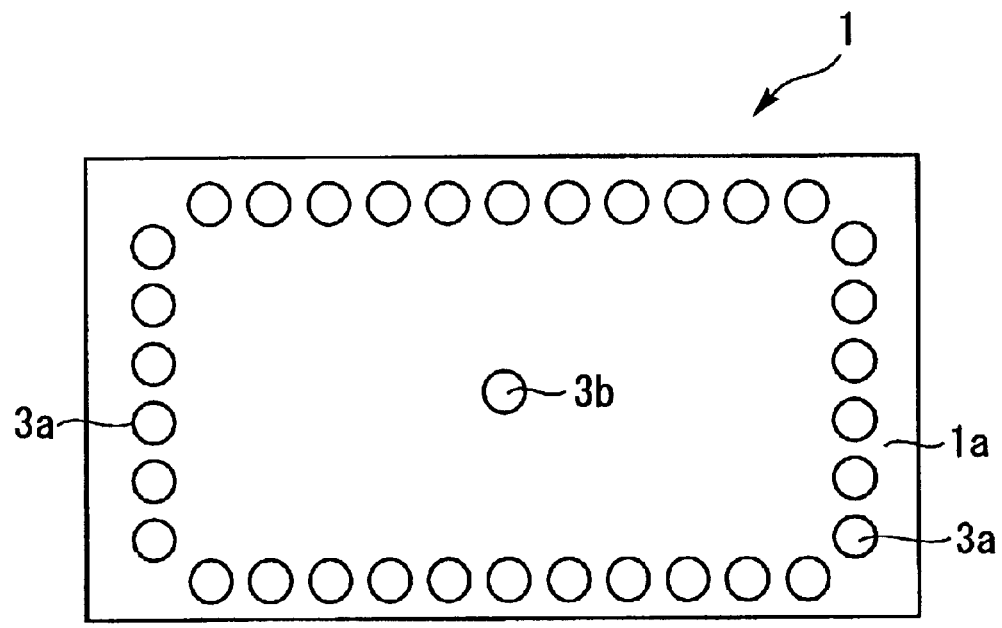
FIG. 1B is a schematic sectional view along line A—A of the semiconductor device of FIG. 1A.

First Embodiment of the present invention will be described in detail below referring to the drawings. FIG. 1A is a schematic sectional view showing a semiconductor device according to First Embodiment of the present invention. FIG. 1B is a schematic sectional view along line A—A of the semiconductor device of FIG. 1A, and shows the arrangement of connecting conductors on the facing surfaces in a chip.

In FIGS. 1A and 1B, the reference numeral 1 denotes a chip as a first substrate; 1a denotes the facing surface (one side) of the chip 1; 2a and 2b denote electrode pads (electrode portions) formed so as to be exposed on the facing surface 1a of the chip 1; 3a and 3b denote bumps (conductors for connecting) for electrically and mechanically connecting the electrode pads 2a and 2b with terminal electrodes; 6 denotes a chip-mounting substrate as a second substrate formed of a glass-epoxy material; and 7 denotes a terminal electrode (electrode portion) having an Au-plated surface layer formed so as to be exposed on the facing surface of the chip-mounting substrate 6.

The chip 1 in First Embodiment has a larger surface area (area of the facing surface 1a) than the surface area of an SAW device having a rectangular surface a side whereof is 3 mm or less.

Here, as FIG. 1B shows, in the side of the facing surface 1a of the chip 1, a plurality of bumps 3a are arranged on the circumferential portion of the facing surface 1a, and a bump 3b is disposed on the central portion of the facing surface 1a.

Also, in the side of the facing surface of the chip-mounting substrate 6, terminal electrodes 7a and 7b are disposed on the locations corresponding to these bumps 3a and 3b, respectively. In other words, a plurality of terminal electrodes 7a are arranged on the circumferential portion of the facing surface of the chip-mounting substrate 6, and a terminal electrode 7b is disposed on the central portion of the facing surface.

The semiconductor device constituted as described above is manufactured through the process using thermo-compression bonding combined with ultrasonic oscillation in the same manner as the manufacturing process described referring to FIGS. 12A to 12D.

In this time, the electrode pad 2b, the bump 3b, and the terminal electrode 7b are disposed in the vicinity of the loop of the oscillation of the mounting material by the ultrasonic oscillation when the electrode pad 2b, the bump 3b, and the terminal electrode 7b are not disposed, and prevent resonance caused by the ultrasonic oscillation.

In other words, the bump 3b and the like disposed on the central portion are supporting members for fixing the central portions of the facing surfaces of both the chip 1 and the chip-mounting substrate 6. The bump 3b and the like as supporting members function as the nodes of oscillation as the bumps 3a and the like arranged on the circumferential portion. Further in other words, in the oscillation mode of the mounting material constituted by the chip 1, the chip-mounting substrate 6, and the like, since the distance between the nodes is very small, the resonance frequency thereof is higher than the frequency of the ultrasonic oscillation.

Therefore, resonance caused by the ultrasonic oscillation is prevented from occurring, and the high bondability of the chip 1 and the chip-mounting substrate 6 by ultrasonic oscillation can be maintained.

Figure 2:
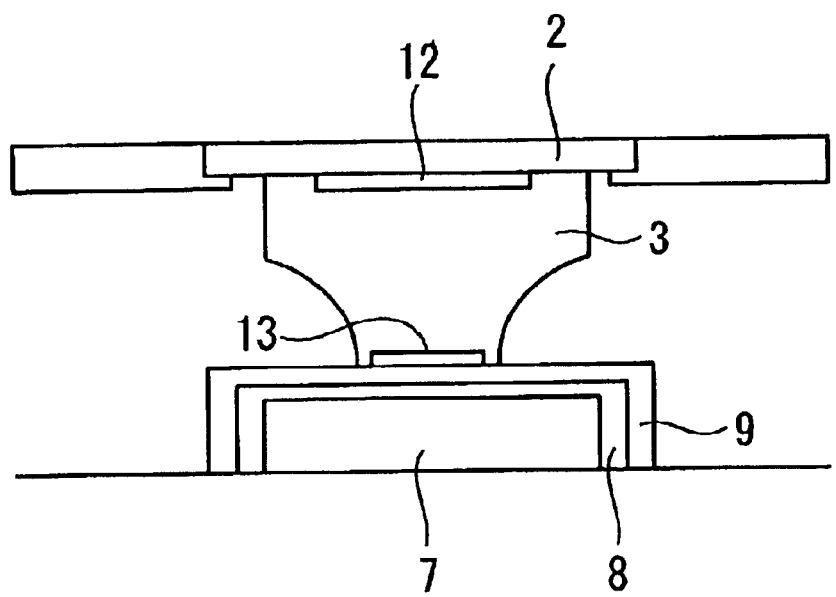
FIG. 2 is a schematic sectional view showing an electrode portion and a connecting conductor in the semiconductor device of FIG. 1A.

Next, the constitution of an electrode portion and a connecting conductor in the semiconductor device of First Embodiment will be described in detail referring to FIG. 2. FIG. 2 is a schematic sectional view showing an electrode portion and a connecting conductor in the semiconductor device of FIG. 1.

As FIG. 2 shows, an Au—Al alloy is microscopically formed on the joining portion 12 between an electrode pad 2 consisting of Al or the like formed so as to be exposed on one side of the chip and the Au-based bump 3.

On the other hand, the terminal electrode 7 formed so as to be exposed on the one side of the chip-mounting substrate is formed by sequentially laminating an Ni-plated layer 8 and an Au-plated layer 9 on a Cu wiring. The Au-plated layer 9 on the terminal electrode 7 is joined to the bump 3 by thermo-compression bonding combined with ultrasonic oscillation, and an Au junction 13 is formed.

Since the formation of the Au junction 13 by thermo-compression bonding combined with ultrasonic oscillation can be achieved at a relatively low temperature (for example, room temperature), materials having low heat resistance, such as organic resins, can be used as the substrate to constitute the mounting material.

In First Embodiment, as described above, any of electrode pads 2a, 2b, bumps 3a, 3b, terminal electrodes 7a, and 7b which are installed in a semiconductor device have a constitution that can transmit and receive electrical signals to and from the circuit in the chip 1 and the circuit in the chip-mounting substrate 6. Therefore, a desired semiconductor device can be formed using an optional electrode pad, a bump, or a terminal electrode among these electrode pads 2a, 2b, bumps 3a, 3b, terminal electrodes 7a, and 7b.

As described above, in the semiconductor device so constituted as in First Embodiment, even when a chip 1 having a relatively large surface area is bonded on a chip-mounting substrate 6 using a bonding method utilizing ultrasonic oscillation, the chip 1 can be mounted on the chip-mounting substrate 6 with a high bondability preventing irregular oscillation without resonance caused by the ultrasonic oscillation.

In First Embodiment, one of the electrode pad 2b, the bump 3b, and the terminal electrode 7b as the supporting member is disposed on the central portion of the semiconductor device. Alternatively, a plurality of electrode pads 2b, bumps 3b, and terminal electrodes 7b as supporting members can be disposed on the locations other than the central portion, for example, metrically. By thus disposing the supporting members on the locations to prevent resonance caused by the ultrasonic oscillation, the same effect as in First Embodiment can be exerted.

Also in First Embodiment, in the semiconductor device manufacturing process, after forming bumps 3a and 3b on the chip 1 side, these are bonded on the terminal electrodes 7a and 7b on the chip-mounting substrate 6 using thermo-compression bonding combined with ultrasonic oscillation. Alternatively, after forming bumps 3a and 3b on the chip-mounting substrate 6, these can be bonded on the electrode pads 2a and 2b on the chip 1 using thermo-compression bonding combined with ultrasonic oscillation. In this case also, the same effect as in First Embodiment can be exerted.

Also in First Embodiment, an electrode pad 2b of the same form as a plurality of electrode pads 2a arranged on the circumferential portion of the chip 1 is disposed on the location different from the locations of the electrode pads 2a (the central portion of the substrate 1), a terminal electrode 7b of the same form as a plurality of terminal electrodes 7a arranged on the corresponding circumferential portion of the chip-mounting substrate 6 is disposed on the location different from the locations of the terminal electrodes 7a, and these are connected with a bump 3b of the same form as, but on the different location from a plurality of bumps 3a. These electrode pad 2b, terminal electrode 7b, and bump 3b constitute a supporting member for preventing resonance caused by ultrasonic oscillation.

However, the constitution of the supporting member is not limited thereto, but, the constitution wherein, for example, the electrode pas 2b on the chip 1 or the terminal electrode 7b on the chip-mounting substrate 6 is removed may also be used. In this case, although the bump 3b forms an Au junction only either substrate 1 or 6, it also contacts the other substrate, and supports both substrates 1 and 6 sufficiently, thus exerting the same effect as in First Embodiment.

Furthermore, the constitution of the supporting member is not limited to the bump 3b and the like, but the constitution wherein, for example, a projecting portion and the like is formed on the substrates 1 and 6 can be used. Also in this case, the same effect as in First Embodiment can be obtained.

Second Embodiment

Figure 3:
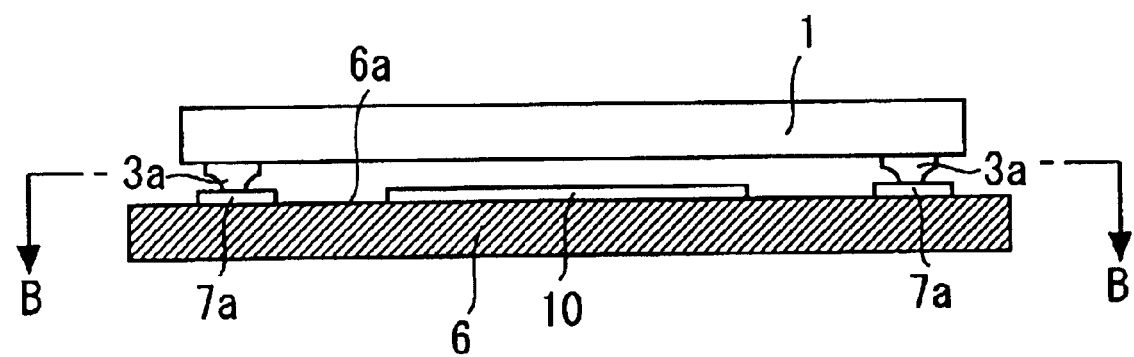
FIG. 3 is a schematic sectional view showing a semiconductor device according to Second Embodiment of the present invention.

Second Embodiment of the present invention will be described in detail below referring to the drawings. FIG. 3 is a schematic sectional view showing a semiconductor device according to Second Embodiment of the present invention. The semiconductor device of Second Embodiment differs from above-described First Embodiment in that a dummy pattern is formed on the chip-mounting substrate instead of forming the bump 3b and the like as a supporting member on the central portion between the chip and the chip-mounting substrate.

In FIG. 3, the reference numeral 1 denotes a chip, 3a denotes bumps, 6 denotes a chip-mounting substrate formed of a glass-epoxy material, 6a denotes the facing surface (one side) of the chip-mounting substrate 6, 7a denotes terminal electrodes, and 10 denotes a dummy pattern as a high-rigidity member.

Here, the dummy pattern 10 is formed on the central portion on the facing surface 6a of the chip-mounting substrate 6 using lithography (photoengraving). Furthermore, the dummy pattern 10 consists of a material having higher rigidity than a glass-epoxy material, such as copper and nickel. The dummy pattern 10 differs from the circuit pattern actually formed on the chip-mounting substrate 6, but is a pattern electrically insulated from circuit elements and the like.

In the semiconductor device constituted as described above, a chip-mounting substrate 6 having a dummy pattern 10 previously formed using lithography is bonded to the chip 1 by the process using thermo-compression bonding combined with ultrasonic oscillation as in First Embodiment.

In this time, the dummy pattern 10 of the chip-mounting substrate 6 disposed on the central portion of the mounting material is disposed in the vicinity of the loop of the oscillation of the mounting material by the ultrasonic oscillation if the dummy pattern 10 is not disposed, and prevents resonance caused by ultrasonic oscillation.

In other words, the dummy pattern 10 disposed on the central portion enhances the rigidity of the chip-mounting substrate 6 as well as the rigidity of the entire mounting material. Therefore, the natural frequency (resonance frequency) of the rigidity-enhanced mounting material is higher than the frequency of the ultrasonic oscillation, and resonance caused by ultrasonic oscillation can be prevented, thus maintaining a high bondability of the chip 1 and the chip-mounting substrate 6 by ultrasonic oscillation.

Figure 4A:
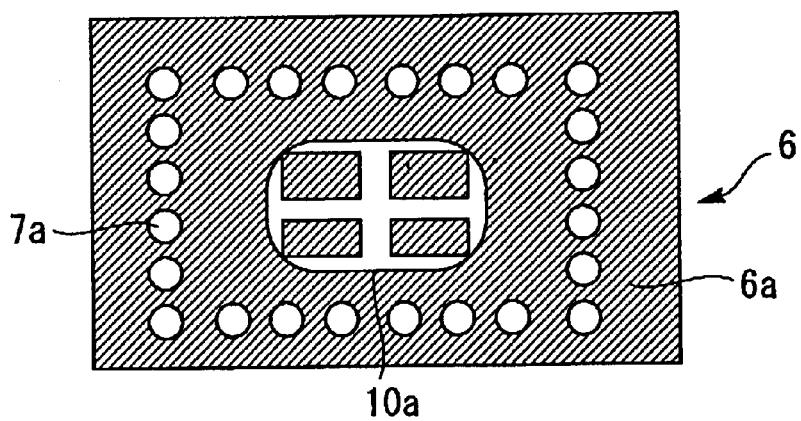
FIGS. 4A to 4C are schematic sectional views taken along line B—B of the semiconductor device in FIG. 3.
Figure 4B:
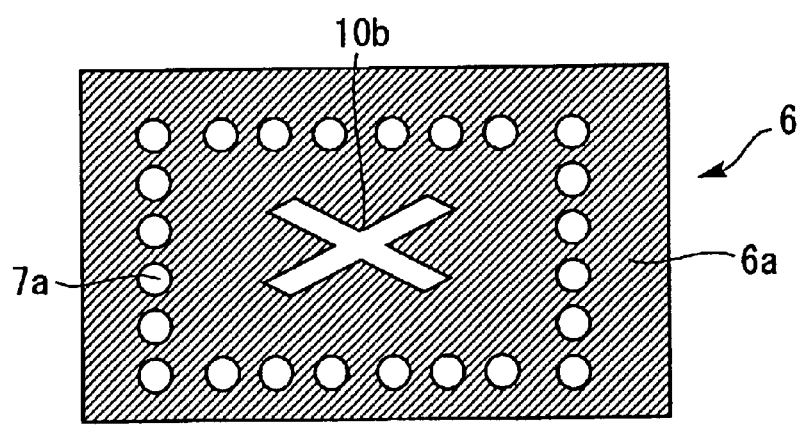
Figure 4C:
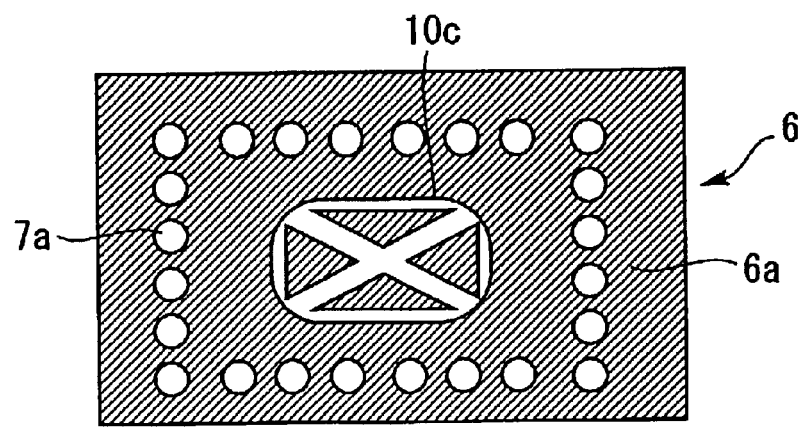

Next, the specific form of the dummy pattern on the chip-mounting substrate in the semiconductor device of Second Embodiment will be described in detail below referring to FIGS. 4A to 4C. FIGS. 4A to 4C are schematic sectional views taken along line B—B of the semiconductor device in FIG. 3, exemplifying the form of a dummy pattern formed on the facing surface of a chip-mounting substrate.

In FIGS. 4A to 4C, the portion without hatching is the pattern portion formed from Cu or the like by lithography on the facing surface 6a of the chip-mounting substrate 6. Specifically, a plurality of terminal electrodes 7a used as actual wiring patterns are formed on the circumferential portion of the chip-mounting substrate 6. Whereas, dummy patterns 10a, 10b, and 10c, which are not used as actual wiring patterns are formed on the central portion of the chip-mounting substrate 6.

In the embodiment shown in FIG. 4A, the dummy pattern 10a is crosswise formed on the central portion of the facing surface 6a.

In the embodiment shown in FIG. 4B, the dummy pattern 10b is formed diagonally to the facing surface 6a on the central portion thereof.

Also in the embodiment shown in FIG. 4C, the dummy pattern 10c is formed so as to add an annular portion around the diagonal dummy pattern of FIG. 4B.

As described above, since the dummy pattern 10 can be formed in optional patterns on the chip-mounting substrate 6 so as to correspond to the specific oscillation mode of the mounting material, resonance caused by ultrasonic oscillation can be prevented effectively.

As described above, in the semiconductor device so constituted as in Second Embodiment, even when a chip 1 having a relatively large surface area is bonded on a chip-mounting substrate 6 using a bonding method utilizing ultrasonic oscillation, as in above-described Example 1, the chip 1 can be mounted on the chip-mounting substrate 6 with a high bondability preventing irregular oscillation without resonance caused by the ultrasonic oscillation.

In Second Embodiment, a dummy pattern 10 is formed as a high-rigidity member on the facing surface 6a of the chip-mounting substrate 6. Alternatively, the dummy pattern 10 as a high-rigidity member may be disposed on the surface opposite to the facing surface 6a of the chip-mounting substrate 6. Also, if the chip 1 is thinned, and the chip 1 resonates, the dummy pattern 10 may be disposed on the surface or the like of the chip 1. In this case, the effects same as the effects of Second Embodiment can be obtained.

Third Embodiment

Figure 5:
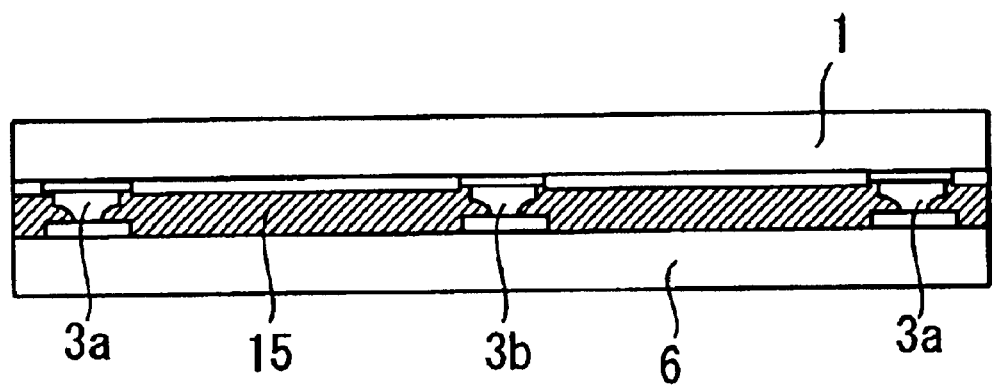
FIG. 5 is a schematic sectional view showing a semiconductor device according to Third Embodiment of the present invention.

Third Embodiment of the present invention will be described in detail below referring to the drawings. FIG. 5 is a schematic sectional view showing a semiconductor device according to Third Embodiment of the present invention. The semiconductor device of Third Embodiment differs from above-described First Embodiment in that a non-conductive resin member contacting both substrates is formed between the chip and the chip-mounting substrate.

In FIG. 5, the reference numeral 1 denotes a chip, 3a and 3b denote bumps, 6 denotes a chip-mounting substrate, and 15 denotes a non-conductive resin member consisting of an epoxy resin or the like.

Here, as in First Embodiment, bumps 3a are arranged on the circumferential portion of the facing surface of the chip 1, and a bump 3b is disposed on the central portion thereof. Furthermore, in Third Embodiment, a non-conductive resin member 15 is formed so as to be sandwiched by the facing surfaces of the chip 1 and the chip-mounting substrate 6.

The semiconductor device constituted as described above can be manufactured chiefly by the following two methods:

The first is a method wherein a non-conductive resin member 15 is previously formed on a chip 1 or a chip-mounting substrate 6, and then the chip 1 is bonded to the chip-mounting substrate 6 by the process using thermo-compression bonding combined with ultrasonic oscillation as in First Embodiment.

The second is a method wherein the chip 1 is bonded to the chip-mounting substrate 6 by the process using thermo-compression bonding combined with ultrasonic oscillation as in First Embodiment, then a non-conductive resin is injected between the both substrates, and is solidified to form a non-conductive resin member 15.

The both semiconductor devices manufactured by these methods have the effect to protect bumps 3a, 3b, the facing surfaces of the substrates, and the like. Furthermore, the semiconductor device manufactured by the former method has the effect to further expand the margin to resonance caused by ultrasonic oscillation, since the non-conductive resin member 15 previously formed on a substrate enhances the rigidity of the mounting material when ultrasonic oscillation is supplied, and supports the loop of the oscillation of the mounting material.

In the semiconductor device constituted according to Third Embodiment, as described above, it is ensured that the bumps 3a, 3b, and the facing surfaces of the chip 1 and the chip-mounting substrate 6 can be protected. Furthermore, even when the chip 1 is bonded to the chip-mounting substrate 6 using a bonding method utilizing ultrasonic oscillation, as in or better than above-described Example 1, the chip 1 can be mounted on the chip-mounting substrate 6 with a high bondability preventing irregular oscillation without resonance caused by the ultrasonic oscillation.

Fourth Embodiment

Figure 6:
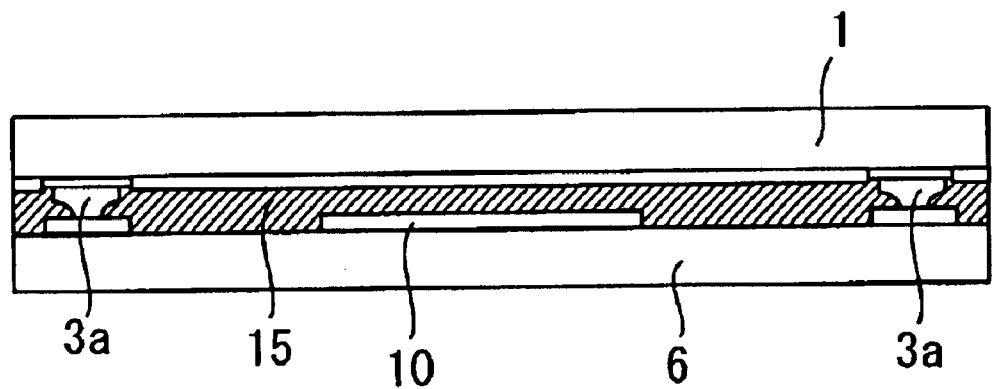
FIG. 6 is a schematic sectional view showing a semiconductor device according to Fourth Embodiment of the present invention.

Fourth Embodiment of the present invention will be described in detail below referring to the drawings. FIG. 6 is a schematic sectional view showing a semiconductor device according to Fourth Embodiment of the present invention. The semiconductor device of Fourth Embodiment differs from above-described Second Embodiment in that a non-conductive resin member contacting both substrates is formed between the chip and the chip-mounting substrate. The semiconductor device of Fourth Embodiment differs from above-described Third Embodiment in that a dummy pattern is formed on the central portion of the substrate in place of the bump.

In FIG. 6, the reference numeral 1 denotes a chip, 3a denotes bumps, 6 denotes a chip-mounting substrate, 10 denotes a dummy pattern formed on the chip-mounting substrate 6, and 15 denotes a non-conductive resin member consisting of an epoxy resin or the like.

Here, as in above-described Second Embodiment, a dummy pattern 10 is formed on the facing surface of the chip-mounting substrate 6. Furthermore, a non-conductive resin member 15 is formed so as to be sandwiched by the facing surfaces of both the chip 1 and the chip-mounting substrate 6.

The semiconductor device constituted as described above can be manufactured chiefly by the two methods as in above-described Example 3.

The semiconductor device manufactured by these methods has the effect to protect bumps 3a, the facing surfaces of the substrates, and the like. Furthermore, in the semiconductor device manufactured by the method to previously form a non-conductive resin member 15 on a substrate has the effect to further expand the margin to resonance caused by ultrasonic oscillation, since the non-conductive resin member 15 enhances the rigidity of the mounting material when ultrasonic oscillation is supplied, and supports the loop of the oscillation of the mounting material.

In the semiconductor device constituted according to Third Embodiment, as described above, it is ensured that the bumps 3a, and the facing surfaces of the chip 1 and the chip-mounting substrate 6 can be protected. Furthermore, even when the chip 1 is bonded to the chip-mounting substrate 6 using a bonding method utilizing ultrasonic oscillation, as in or better than above-described Second Embodiment, the chip 1 can be mounted on the chip-mounting substrate 6 with a high bondability preventing irregular oscillation without resonance caused by the ultrasonic oscillation.

Fifth Embodiment

Figure 7:
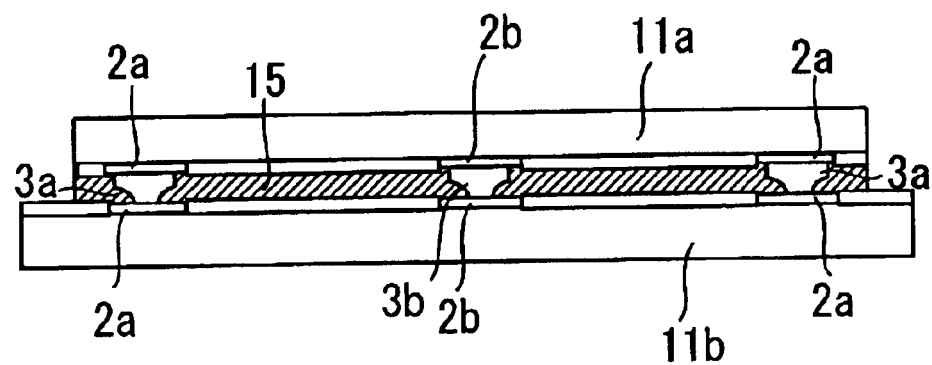
FIG. 7 is a schematic sectional view showing a semiconductor device according to Fifth Embodiment of the present invention.

Fifth Embodiment of the present invention will be described in detail below referring to the drawings. FIG. 7 is a schematic sectional view showing a semiconductor device according to Fifth Embodiment of the present invention. The semiconductor device of Fifth Embodiment differs from above-described Third Embodiment in that a chip is disposed as a second substrate in place of the chip-mounting substrate.

In FIG. 7, the reference numerals 2a and 2b denote electrode pads, 3a and 3b denotes bumps, 11a denotes a chip as a first substrate, 11b denotes a chip as a second substrate, and 15 denotes a non-conductive resin member.

Here, electrode pads 2a and 2b are formed on the facing surfaces of the both chips 11a and 11b so as to be exposed on the facing surfaces. Specifically, electrode pads 2a are arranged on the circumferential portion of the facing surface of each of chips 11a and 11b, and an electrode pad 2b is disposed on the central portion thereof. Furthermore, in Fifth Embodiment, as in above-described Third Embodiment, a non-conductive resin member 15 is formed so as to be sandwiched between the facing surfaces of the both chips 11a and 11b.

The semiconductor device constituted as described above can be manufactured by connecting the electrode pads 2a and 2b of the chips 11a and 11b through bumps 3a and 3b, respectively, using thermo-compression bonding combined with ultrasonic oscillation.

Figure 8:
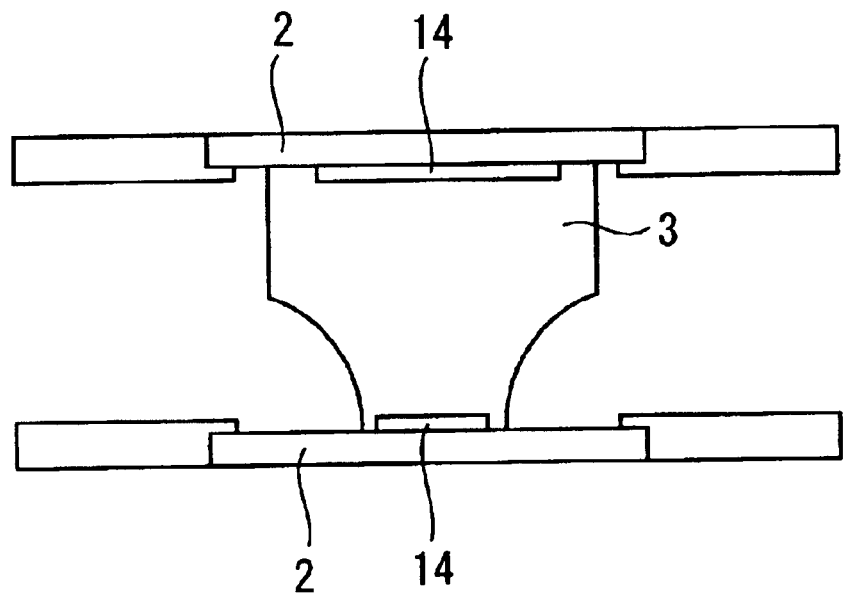
FIG. 8 is a schematic sectional view showing the electrode portion and the connecting conductor in the semiconductor device of FIG. 7.

The constitutions of an electrode portion and a connecting conductor in the semiconductor device of Fifth Embodiment will be described in detail below referring to FIG. 8. FIG. 8 is a schematic sectional view showing the electrode portion and the connecting conductor in the semiconductor device of FIG. 7.

As FIG. 8 shows, each of electrode pads 2 consisting of Al or the like formed so as to be exposed on one side of each chip is bonded to each of Au-based bumps 3 by thermo-compression bonding combined with ultrasonic oscillation, and each of junctions 14 consisting of an Au—Al alloy is formed.

Specifically, an oxide film (naturally oxidized film) is normally formed on the surface of an Al electrode. This oxide film is eliminated from the interface by ultrasonic oscillation, and a high-quality Au—Al alloy is formed in the junction 14 between the electrode pad 2 and the bump 3.

Also, since the formation of such a junction 14 of an Au—Al alloy by thermo-compression bonding combined with ultrasonic oscillation can be achieved at a relatively low temperature, materials having low heat resistance, such as organic resins, can be used as the substrate to constitute the mounting material.

As described above, even a highly integrated semiconductor device formed by laminating a plurality of chips 11a and 11b as in Fifth Embodiment, the same effect as in above-described Example 3 can be achieved. Especially, since the thickness of a highly integrated semiconductor device is thin, the constitution of Fifth Embodiment can maximize the rigidity of a thin semiconductor device. Thereby, the chip 11a can be mounted on the chip 11b with a high bondability preventing irregular oscillation without resonance caused by the ultrasonic oscillation.

Sixth Embodiment

Figure 9:
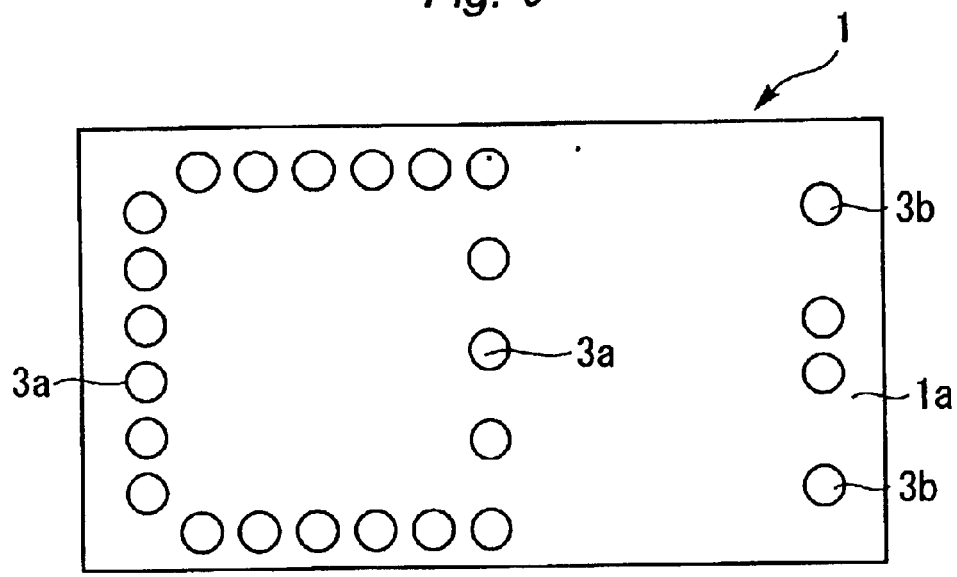
FIG. 9 is a schematic sectional view showing a semiconductor device according to Sixth Embodiment of the present invention.

Sixth Embodiment of the present invention will be described in detail below referring to the drawings. FIG. 9 is a schematic sectional view showing a semiconductor device according to Sixth Embodiment of the present invention. The semiconductor device of Sixth Embodiment differs from above-described First Embodiment in the arrangement of bumps disposed on the facing surface of the chip.

In FIG. 9, the reference numeral 1 denotes a chip, 1a denotes the facing surface of the chip 1 facing the chip-mounting substrate, and 3a and 3b denote bumps formed on the electrode pads exposed on the facing surface 1a.

Here, a plurality of electrode pads 2a are circumferentially arranged on a partial region (the region in the left side of the page) of the facing surface 1a of the chip, and a plurality of electrode pads 2b are linearly arranged on the outer region (the region in the right side of the page) of the partial region whereon the electrode pads 2a are circumferentially arranged.

Although a chip-mounting substrate comprising terminal electrodes corresponding to a plurality of bumps 3a and 3b arranged on the chip 1 is also disposed in the semiconductor device of Sixth Embodiment as in above-described First Embodiment, the illustration thereof is omitted for simplification.

The semiconductor device constituted as described above is manufactured through a process for bonding the chip 1 and the chip-mounting substrate by thermo-compression bonding combined with ultrasonic oscillation as in above-described First Embodiment.

In the semiconductor device of Sixth Embodiment, as described above, even if the locations of the bumps 3a and the like between the substrates to be bonded are concentrated in a specific region of the substrates due to the circuit constitution of the semiconductor device, the bump 3b or the like as a supporting member is disposed in the vicinity of the loop of the oscillation of the mounting material. Thereby, the chip 1 can be mounted on the chip-mounting substrate with a high bondability preventing irregular oscillation without resonance caused by the ultrasonic oscillation.

Seventh Embodiment

Figure 10:
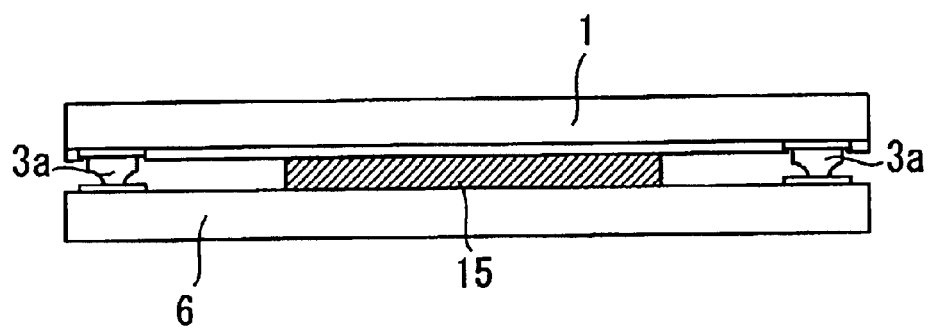
FIG. 10A and FIG. 10B are schematic sectional views showing a semiconductor device according to Seventh Embodiment of the present invention.
Figure 10B:
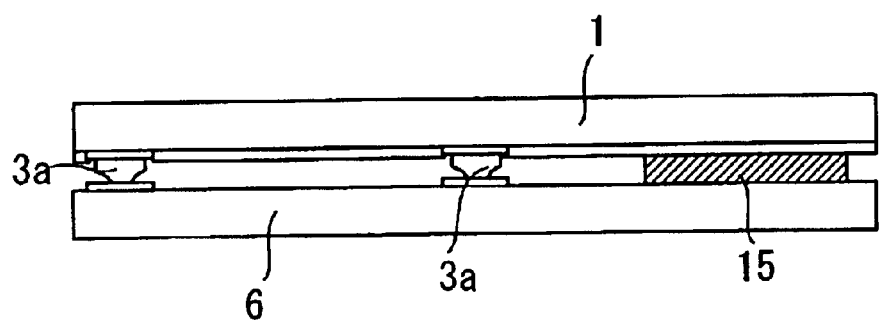

Seventh Embodiment of the present invention will be described in detail below referring to the drawings. FIG. 10A and FIG. 10B are schematic sectional views showing a semiconductor device according to Seventh Embodiment of the present invention. The semiconductor device of Seventh Embodiment differs from above-described Third and Fourth Embodiments in the arrangement and the like of the non-conductive resin member formed between the chip and the chip-mounting substrate.

In FIG. 10A and FIG. 10B, the reference numeral 1 denotes a chip, 3a denotes bumps, 6 denotes a chip-mounting substrate, and 15 denotes a non-conductive resin member.

In the semiconductor device shown in FIG. 10A, bumps 3a are arranged only on the circumferential portion of the substrate, and a non-conductive resin member 15 is disposed on the central portion of the substrate.

Whereas in the semiconductor device shown in FIG. 10B, bumps 3a are circumferentially arranged only on a side region of the substrate, and a non-conductive resin member 15 is disposed on the opposed end region.

Both the semiconductor devices constituted as described above are manufactured through the process wherein a non-conductive resin member 15 is formed on the substrate, and then the chip 1 is bonded to the chip-mounting substrate 6 by thermo-compression bonding combined with ultrasonic oscillation.

In the semiconductor device of Seventh Embodiment, as described above, regardless of the locations of the bumps 3a between the substrates to be bonded due to the circuit constitution of the semiconductor device, the non-conductive resin member 15 as the supporting member is adequately disposed in the vicinity of the loop of the oscillation of the mounting material. Thereby, the chip 1 can be mounted on the chip-mounting substrate 6 with a high bondability preventing irregular oscillation without resonance caused by the ultrasonic oscillation.

Eighth Embodiment

Figure 11A:
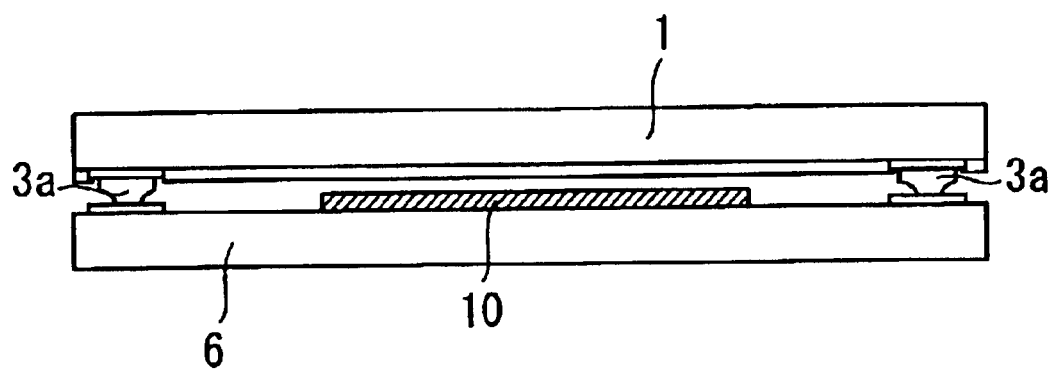
FIG. 11A is a diagram showing the arrangement of the dummy pattern on the chip-mounting substrate of FIG. 3.
Figure 11B:
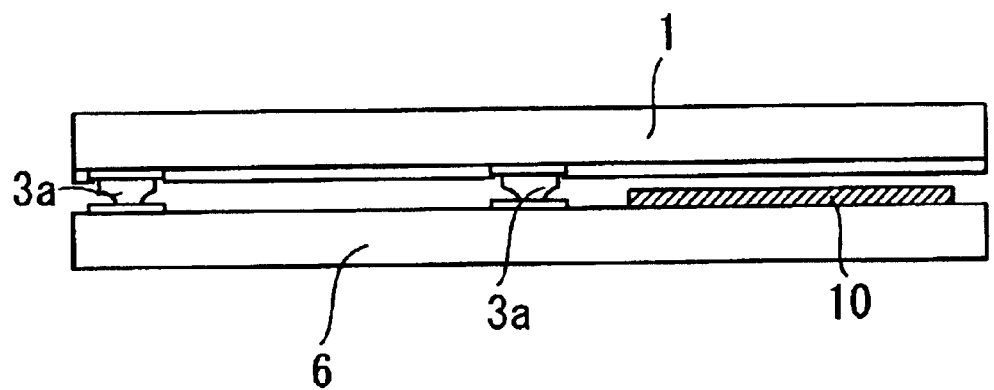
FIG. 11B is a diagram showing the variation in the arrangement of the dummy pattern on the chip-mounting substrate.
Figure 12A:
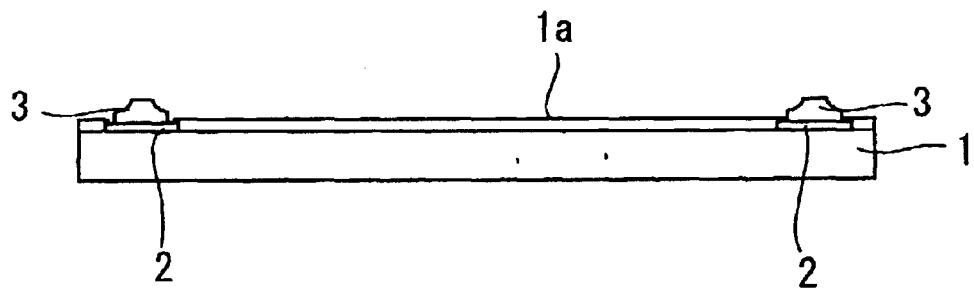
FIG. 12A to FIG. 12D are schematic sectional views of a conventional semiconductor device in each bonding step of the manufacturing process.
Figure 12B:
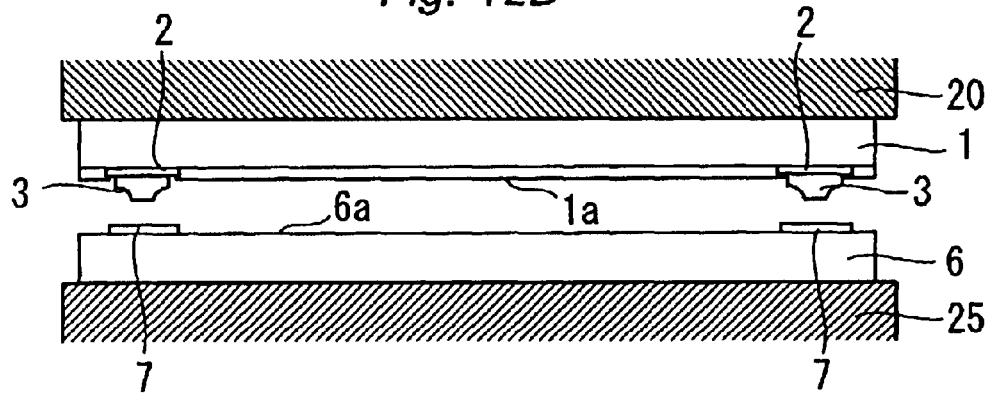
Figure 12C:
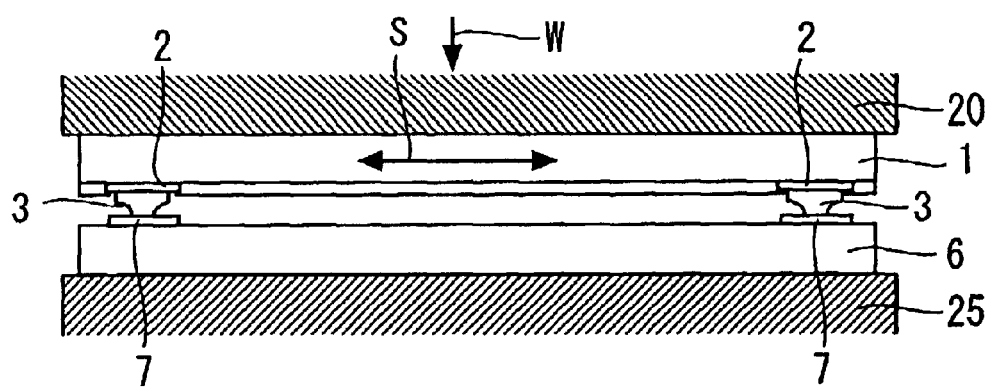
Figure 12D:
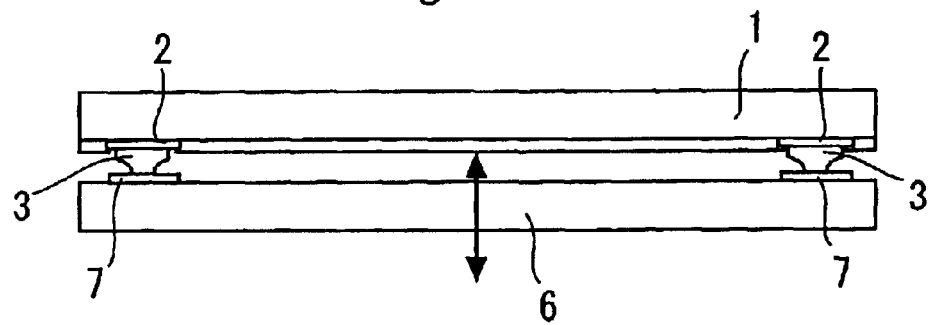

Eighth Embodiment of the present invention will be described in detail below referring to the drawings. FIG. 11A and FIG. 11B are schematic sectional views showing a semiconductor device according to Eighth Embodiment of the present invention. In Eighth Embodiment, FIG. 11A is a diagram showing the arrangement of the dummy pattern on the chip-mounting substrate in above-described Second Embodiment. Whereas, FIG. 11B is a diagram showing the variation in the arrangement of the dummy pattern on the chip-mounting substrate, which is different from above-described Second Embodiment.

In FIG. 11A and FIG. 11B, the reference numeral 1 denotes a chip, 3a denotes bumps, 6 denotes a chip-mounting substrate, and 10 denotes a dummy pattern.

In the semiconductor device shown in FIG. 11A, bumps 3a are arranged only on the circumferential portion of the chip-mounting substrate 6, and a dummy pattern 10 is disposed on the central portion of the substrate.

Whereas in the semiconductor device shown in FIG. 11B, bumps 3a are circumferentially arranged only on a side region of the substrate, and a dummy pattern 10 is disposed on the opposed region on the end portion of the chip-mounting substrate 6.

Both the semiconductor devices constituted as described above are manufactured through the process wherein the chip-mounting substrate 6 whereon a dummy pattern 10 is previously formed by lithography is bonded to the chip 1 by thermo-compression bonding combined with ultrasonic oscillation.

In the semiconductor device of Eighth Embodiment, as described above, regardless of the locations of the bumps 3a between the substrates to be bonded due to the circuit constitution of the semiconductor device, the dummy pattern 10 as the high-rigidity member is adequately disposed in the vicinity of the loop of the oscillation of the mounting material on the chip-mounting substrate 6. Thereby, the chip 1 can be mounted on the chip-mounting substrate 6 with a high bondability preventing irregular oscillation without resonance caused by the ultrasonic oscillation.

In the above-described embodiments, a chip is used as a first substrate, and a chip-mounting substrate or chip, such as a mounting board and an interposer, is used as a second substrate. However, the first and second substrates are not limited thereto, but the present invention can be applied to any combinations of substrates that can be bonded utilizing ultrasonic oscillation. For example, a substrate formed by laminating a plurality of chips can be used as a first substrate, and a circuit substrate whereon elements, such as capacitors, and chips are mounted can be used as a second substrate. In this case also, the same effect as in the above-described embodiments can be achieved.

Also in the above-described embodiments, although bumps 3, 3a, and 3b having trapezoidal cross sections are used as connecting conductors, the shape of the connecting conductor used in the present invention is not limited thereto, but for example, a columnar bump or the like can also be used. In this case also, the same effect as in the above-described embodiments can be achieved.

Also in the above-described embodiments, although the first substrate and the second substrate are formed in substantially the same surface areas, the present invention can also be applied to the case where the surface areas thereof are different.

Also in the above-described embodiments, the frequency of the ultrasonic oscillation supplied to the mounting material is about 60 kHz, and the direction of oscillation is parallel to the surface of the substrate. However, the present invention is not limited thereto, but the present invention can also be applied to the process using the ultrasonic oscillation of different frequency and direction. In this case, the semiconductor device suitable for preventing resonance caused by the ultrasonic oscillation of different frequency and direction should be constituted. In other words, the appropriate number, location, and shape of the supporting member, the high-rigidity member, and the like described in the above-described embodiments can be selected depending on the ultrasonic oscillation used in the process.

It is obvious that the present invention is not limited to the above-described embodiments, and the embodiments can be modified to those other than suggested in each embodiment within the scope of the technical concept of the present invention. In particular, the semiconductor device whereto the present invention can be applied is not limited to the structures of semiconductor devices shown in each of the above-described embodiments, but the present invention can be applied to structures, such as a chip-laminated package, CSP, and a module.

Also, the number, location, shape, and the like of the above-described constituting members are not limited to the above-described embodiments, but the number, location, shape, and the like suitable for carrying out the present invention can be selected.

It is further understood that the foregoing description is a preferred embodiment of the disclosed device and method and that various changes and modifications may be made in the invention without departing from the spirit and scope thereof.

The entire disclosure of a Japanese Patent Application No.2001-296333, filed on Sep. 27, 2001 including specification, claims drawings and summary, on which the Convention priority of the present application is based, are incorporated herein by reference in its entirety.

What is claimed is:

1. A semiconductor device comprising:
a first substrate having a plurality of electrode portions disposed on one side thereof;
a second substrate having a plurality of electrode portions disposed on one side thereof;
a plurality of conductors for connecting said plurality of electrode portions of said first substrate to said plurality of electrode portions of said second substrate; and
a supporting member for supporting said first substrate and said second substrate disposed at a location to prevent resonance caused by ultrasonic oscillation externally supplied, wherein said first substrate is connected to said second substrate by bumps using thermo-compression bonding combined with ultrasonic oscillation.

2. The semiconductor device according to claim 1, wherein said supporting member is disposed in the vicinity of where the loop of oscillation would otherwise occur without said supporting member.

3. The semiconductor device according to claim 1, wherein said plurality of electrode portions are disposed on the circumferential portion of said first substrate, and on the location of said second substrate corresponding to said circumferential portion; and said supporting member is disposed on the central portion of said first substrate.

4. The semiconductor device according to claim 1, wherein said purality of electrode portions are disposed circumferentially on a partial region of said first substrate and on the locations of said second substrate corresponding to said partial region, and said supporting members are disposed on the outer region of said partial region of said first substrate.

5. The semiconductor device according to claim 1, wherein said supporting members are made by connecting electrode portions having the same shape as said plurality of electrode portions formed on said first substrate but in a different location, and electrode portions having the same shape as said plurality of electrode portions fanned on said second substrate but in the different location, with a conductor for connection having the same shape as said plurality of conductors for connection but in the different location.

6. The semiconductor device according to claim 1, wherein said first substrate or said second substrate further comprises a high rigidity member for enhancing the rigidity of said substrate.

7. The semiconductor device according to claim 6, wherein said high-rigidity member is a dummy member insulated from circuit elements.

8. The semiconductor device according to claim 1, further comprising a non-conductive resin member connecting said first substrate and said second substrate.

9. The semiconductor device according to claim 1, wherein said first substrate is a chip having said plurality of electrode portions comprising electrode pads; and
said second substrate is a chip mounting substrate having said plurality of electrode portions comprising electrode pads.

10. The semiconductor device according to claim 1, wherein each of said first substrate and said second substrate is a chip having said plurality of electrode portions comprising electrode pads.

11. A semiconductor device comprising:
a first substrate having a plurality of electrode portions disposed on one side thereof;
a second substrate having a plurality of electrode portions disposed on one side thereof;
a plurality of conductors for connecting said plurality of electrode portions of said first substrate to said plurality of electrode portions of said second substrate; and
a high-rigidity member for enhancing the rigidity of said substrates formed on said first substrate or said second substrate disposed to prevent resonance caused by ultrasonic oscillation externally supplied, wherein said first substrate is connected to said second substrate by bumps using thermo-compression bonding combined with ultrasonic oscillation.

12. The semiconductor device according to claim 11, wherein said plurality of electrodes are disposed on the circumferential portion of said first substrate, and on the location of said second substrate corresponding to said circumferential portion; and said high-rigidity member is disposed on the central portion of said first substrate or on the central portion of said second substrate.

13. The semiconductor device according to claim 11, wherein said plurality of electrodes are disposed circularly on a partial region of said first substrate and on the locations of said second substrate corresponding to said partial region, and said high-rigidity member is disposed on the outer region of said partial region of said first substrate or on the outer region of said partial region of said second substrate.

14. The semiconductor device according to claim 11, wherein said high-rigidity member is a dummy member insulated from circuit elements.

15. The semiconductor device according to claim 11, further comprising a non-conductive resin member connecting said first substrate and said second substrate.

16. The semiconductor device according to claim 11, wherein said first substrate is a chip having said plurality of electrode portions comprising electrode pads; and
said second substrate is a chip mounting substrate having said plurality of electrode portions comprising electrode pads.

17. The semiconductor device according to claim 11, wherein each of said first substrate and said second substrate is a chip having said plurality of electrode portions comprising electrode pads.

* * * * *